US007804301B2

(12) United States Patent
Tanaka

(10) Patent No.: US 7,804,301 B2
(45) Date of Patent: Sep. 28, 2010

(54) NMR PROBE

(75) Inventor: Hideki Tanaka, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 211 days.

(21) Appl. No.: 12/125,180

(22) Filed: May 22, 2008

(65) Prior Publication Data

US 2009/0174406 A1 Jul. 9, 2009

(30) Foreign Application Priority Data

May 23, 2007 (JP) ............................. 2007-136828

(51) Int. Cl.
G01V 3/00 (2006.01)
(52) U.S. Cl. ...................... 324/318; 324/322
(58) Field of Classification Search ................ 324/318, 324/322
See application file for complete search history.

(56) References Cited

U.S. PATENT DOCUMENTS

| 5,545,994 A * | 8/1996 | Barbara ....................... 324/315 |
| 5,705,014 A * | 1/1998 | Schenck et al. .......... 156/272.4 |
| 6,054,855 A * | 4/2000 | Anderson ................... 324/318 |
| 7,202,667 B2 * | 4/2007 | Barbic ........................ 324/318 |

FOREIGN PATENT DOCUMENTS

| JP | 63-38150 | 2/1988 |
| JP | 2005-121455 | 5/2005 |

OTHER PUBLICATIONS

U.S. Appl. No. 11/836,867, filed Aug. 10, 2007, Tanaka, et al.

* cited by examiner

*Primary Examiner*—Louis M Arana
(74) *Attorney, Agent, or Firm*—Antonelli, Terry, Stout & Kraus, LLP.

(57) ABSTRACT

An NMR probe is provided that prevents homogeneity of the static magnetic field from being reduced in a sensitive area of an RF coil used for measuring an NMR signal. The RF coil is wound around a bobbin, and mounted on the NMR probe. In the NMR probe, a substance having a magnetic susceptibility of the same polarity as that of the RF coil is disposed on a surface of the bobbin which is not contacted by the RF coil. Alternatively, the bobbin is formed with grooves, and the RF coil is wound around the grooves. The bulk susceptibility of the bobbin or RF coil winding is adjusted such that the difference between the product of the depth of the groove and bulk susceptibility of the bobbin and the product of winding thickness and bulk susceptibility of the RF coil winding is 5 percent or less.

5 Claims, 4 Drawing Sheets

NMR PROBE

BACKGROUND OF THE INVENTION

The present invention relates to an NMR (nuclear magnetic resonance) probe equipped with RF (Radio Frequency) coils for measuring an NMR signal.

Typically, in the NMR probe, a solenoidal coil is used for the RF coil, as described in JP-A-2005-121455 (Abstract).

As described in JP-A-2005-121455, it is known that the solenoidal coil is used for the RF coil for measuring the NMR signal and the solenoidal coil is disposed such that the axis of the solenoidal coil is perpendicular to the direction of a static magnetic field. However, the solenoidal coil disposed in the static magnetic field becomes a factor for reducing homogeneity of the static magnetic field.

SUMMARY OF THE INVENTION

Therefore, it is an object of the present invention to provide an NMR probe for inhibiting the homogeneity of the static magnetic field from being reduced in a sensitive area of the RF coil used for measuring the NMR signal.

The NMR probe according to the present invention is equipped with the RF coils that are used for high frequency transmission, reception, or transmission/reception during the measurement of the NMR signal. Moreover, in the NMR probe, a substance that has a magnetic susceptibility of the same polarity as that of the RF coil is disposed between coil windings and outside the coil windings.

Additionally, the NMR probe according to the present invention comprises the RF coils that are used for high frequency transmission, reception or transmission/reception during the measurement of the NMR signal, and a bobbin for winding the RF coils, wherein the surface of the bobbin is formed with grooves for winding the RF coils therearound. In the NMR probe, at least one of the bobbin and RF coil winding is constituted of material whose bulk susceptibility is adjusted in such a way that the difference between the product of the depth of the groove and bulk susceptibility of the bobbin and the product of the winding thickness and bulk susceptibility of the RF coil winding is 5 percent or less.

The present invention is capable of improving the homogeneity of the static magnetic field in a sample area. This causes a nuclear magnetic resonance frequency of the entire sample to have a constant value or a substantially constant value, makes thinner the base of a spectrum of the NMR signal that is obtained by Fourier transform, heightens the spectrum peak, and thereby enhances measurement sensitivity.

Other objects, features and advantages of the invention will become apparent from the following description of the embodiments of the invention taken in conjunction with the accompanying drawings.

DESCRIPTION OF EMBODIMENTS

The RF coil for transmitting and receiving the NMR signal is constituted of a wire or a foil that has some magnetic susceptibility, and the RF coil is disposed as close as possible to the sample area. Typically, the presence of the RF coil would reduce the homogeneity of magnetic field in the sample area, even if the RF coil is fabricated from material that is referred to as a non-magnetic substance.

The present invention is configured such that the problem of a decrease in the static magnetic field homogeneity caused by the RF coil is solved without depending on the shape or the number of windings of the RF coil.

A first solution for solving the problem of the decrease in the homogeneity of static magnetic field caused by the RF coil according to the present invention is to dispose a substance having a magnetic susceptibility of the same polarity as that of the RF coil between coil windings and outside the coil windings. More specifically, it is preferable that the substance having the magnetic susceptibility of the same polarity as that of the RF coil is disposed on a surface of the bobbin, around which the RF coil is to be wound, which is not contacted by the RF coil.

A second solution according to the present invention is a probe that has the RF coils and a bobbin for winding the RF coils therearound, the bobbin having grooves for winding the RF coils therearound, wherein at least one of the bobbin and winding of the RF coil is constituted of material whose bulk susceptibility is adjusted in such a way that the difference between the product of the depth of the groove and bulk susceptibility of the bobbin and the product of the winding thickness and bulk susceptibility of the RF coil winding is 5 percent or less.

The substance having a magnetic susceptibility of the same polarity as that of the RF coil and the bobbin are constituted of an insulant. Therefore, it is not required to flow high frequency current to them. They are disposed on predetermined positions and a static magnetic field is applied to them as well as to the RF coil. Thus, they serve to improve the static magnetic field homogeneity.

Embodiments of the present invention will be described with reference to appended drawings in the following paragraphs. However, it should be noted that the present invention is not limited to the described embodiments.

Figure 1A:
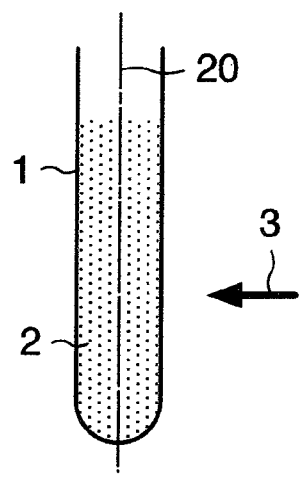
FIGS. 1A and 1B are diagrams showing directional relationships between a static magnetic field direction and the axis of a sample tube.
Figure 1B:
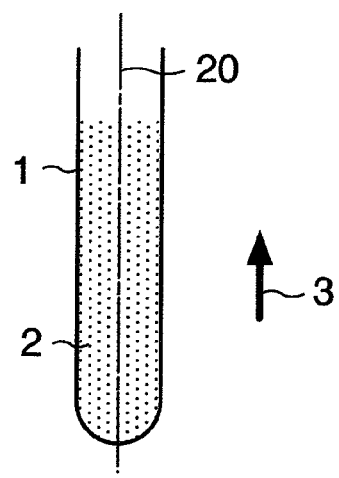

FIGS. 1A and 1B are diagrams showing directional relationships between a static magnetic field direction 3 and the axis 20 of a test tube in an apparatus for obtaining an NMR signal. FIG. 1A shows a case where the static magnetic field direction 3 is perpendicular to the axis 20 of the test tube 1 that contains a sample 2. FIG. 1B shows a case where the static magnetic field direction 3 is in parallel with the axis 20 of the test tube.

Various shapes of RF coils, such as a saddle-shaped RF coil, a bird cage-shaped RF coil, and a solenoidal RF coil, are used for obtaining the NMR signal. Whichever one is used, disposition is made such that the static magnetic field direction is mutually perpendicular to the RF magnetic field direction generated by the RF coil.

The present invention can be applied regardless of the directional relationships shown in FIGS. 1A and 1B and the coil shapes.

Embodiment 1

Figure 2A:
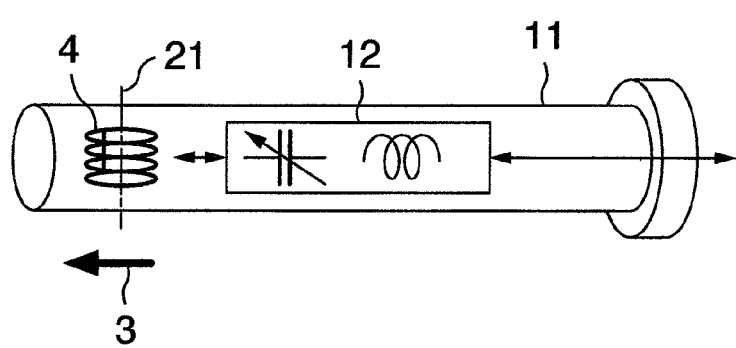
FIGS. 2A and 2B are diagrams showing positional relationships between a probe and an RF coil.
Figure 2B:
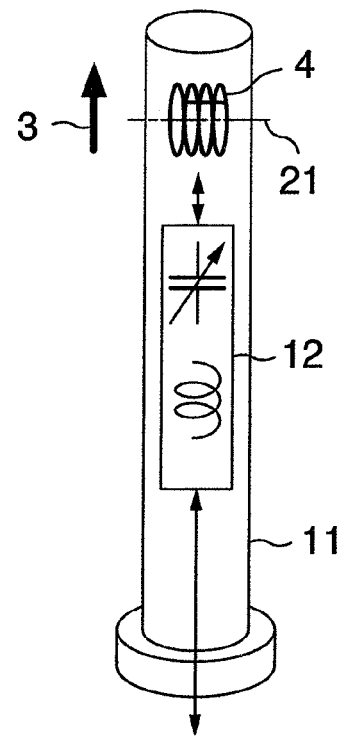

FIGS. 2A and 2B are explanatory diagrams showing positional relationships between a probe and a solenoidal RF coil in an apparatus for obtaining an NMR signal. A static magnetic field 3 heading towards a static magnetic field direction is generated by a static magnetic field generating apparatus such as a superconducting magnet. An RF coil 4, which is a target of the present invention, is mounted in a probe 11, and is disposed near the center of the static magnetic field such that axis 21 of the RF coil is perpendicular to the static magnetic field direction 3. The RF coil 4 is adjusted to resonate at a predetermined frequency by a resonance circuit 12 which is disposed inside the probe. The RF coil 4 transmits and receives a high-frequency signal to and from an apparatus outside the probe, such as a high-frequency transmission/reception apparatus, via a resonance circuit 12, and a coaxial cable or the like. The longitudinal direction of the probe may be horizontal as shown in FIG. 2A, or may be vertical as shown in FIG. 2B according to the static magnetic field direction 3.

Figure 3:
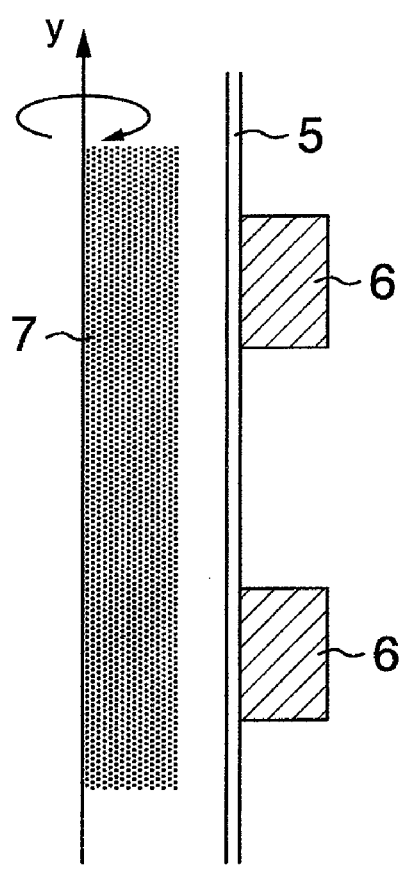
FIG. 3 is a cross sectional diagram of a coil when the present invention is not applied.

FIG. 3 is a schematic diagram of the solenoidal RF coil when the present invention is not applied. FIG. 3 shows a positional relationship between a sample area 7, a bobbin 5, and solenoidal RF coils 6 by means of a cross-sectional diagram. These shapes are rotationally symmetrical with respect to a y axis shown in FIG. 3.

Figure 4:
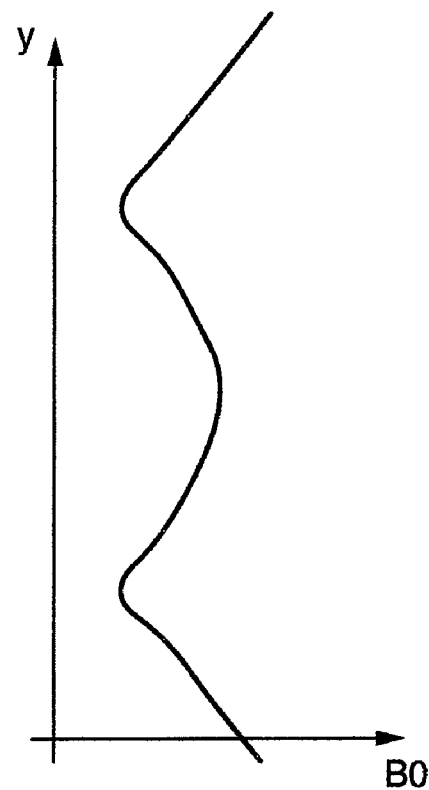
FIG. 4 is a graph showing a distribution of static magnetic field strength when the present invention is not applied.

FIG. 4 is a graph showing a distribution along a y axis of the static magnetic field strength in the sample area 7 shown in FIG. 3. The lateral axis represents an absolute value of the static magnetic field strength, while the vertical axis represents the direction and length of a coil axis. As FIG. 4 shows, the static magnetic field strength differs between a position near the coil wire material and a position between the coil wires when the coil wires are magnetized. This heterogeneity decreases the measuring sensitivity for measuring the NMR signal.

Figure 5:
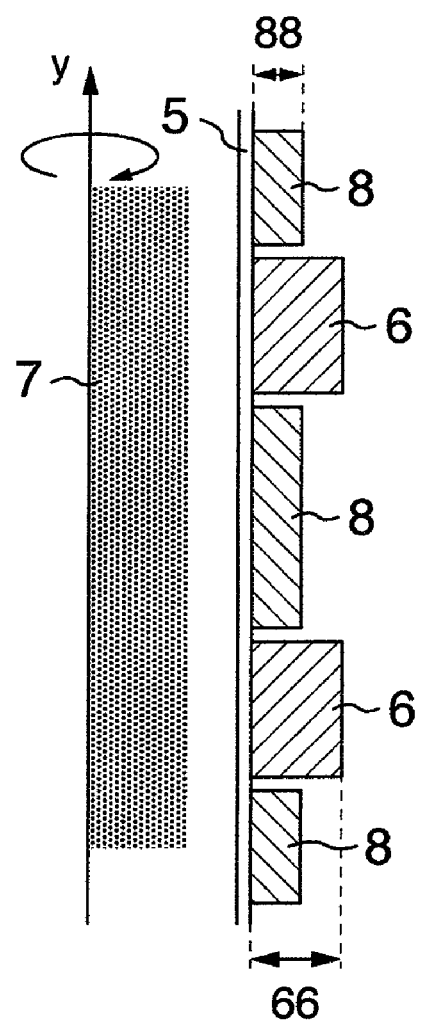
FIG. 5 is a cross sectional diagram of a coil according to an embodiment 1 of the present invention.

FIG. 5 is a schematic diagram of a solenoidal RF coil when the present invention is applied. A substance having a magnetic susceptibility of the same polarity as that of the RF coil (referred to as a compensating substance 8 hereinafter) is disposed on a surface of the bobbin which is not contacted by the RF coil.

Figure 6:
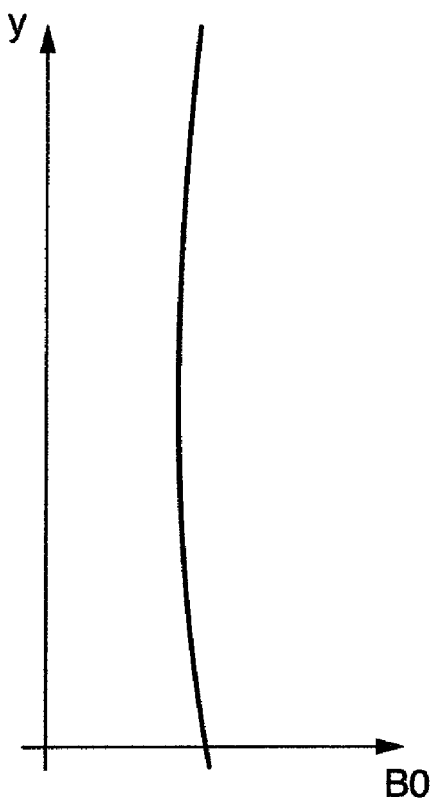
FIG. 6 is a graph showing a distribution of static magnetic field strength according to the embodiment 1 of the present invention.

FIG. 6 is a graph showing a distribution along a y axis of the static magnetic field strength in the sample area 7 which is shown in FIG. 5, wherein the lateral and vertical axes are the same as those shown in FIG. 4. It is represented that when the product of thickness 88 of the compensating substance 8 and bulk susceptibility of the compensating substance 8 shown in FIG. 5 is equal to the product of thickness 66 of the RF coil 6 and bulk susceptibility of the RF coil 6 shown in FIG. 5, the magnetic field strength of the sample area 7 becomes homogeneous. This is based on the perception that when a cylinder having a homogeneous magnetic susceptibility is disposed in a static magnetic field, the magnetic field strength near the center of the cylinder becomes homogeneous.

An exemplary fabrication of the compensating substance 8 will be described in the following paragraph.

In order to achieve the static magnetic field homogeneity shown in FIG. 6, the amount of the compensating substance 8 is required to be adjusted. First, a method will be described that measures a distribution of the static magnetic field strength in the sample area. A simple way is to use a gradient magnetic field. However, in the case of an NMR system in which the gradient magnetic field is not allowed to be used, light water of approximately 1 microliter which is sealed in a capillary tube may be used as a sample. This sample may be disposed in an area desired to be measured, and a resonance frequency is measured.

The polarity of the magnetic susceptibility of the compensating substance 8 is determined by the polarity of the magnetic susceptibility of the coil. Therefore, it is necessary to know the magnetic susceptibility of the coil material. The magnetic susceptibility of the coil material can be known by performing measurement using a SQUID or the like. Alternatively, it can be read from the static magnetic field strength distribution. The compensating substances having a negative magnetic susceptibility include, for example, a polyimide varnish or the like. The compensating substances having a positive magnetic susceptibility include a mixture of a polyimide varnish and material having a positive magnetic susceptibility, for example, powder of an aluminum nitride or the like. The coating amount may be adjusted while the effect obtained by the static magnetic field correction is observed.

Embodiment 2

Figure 7:
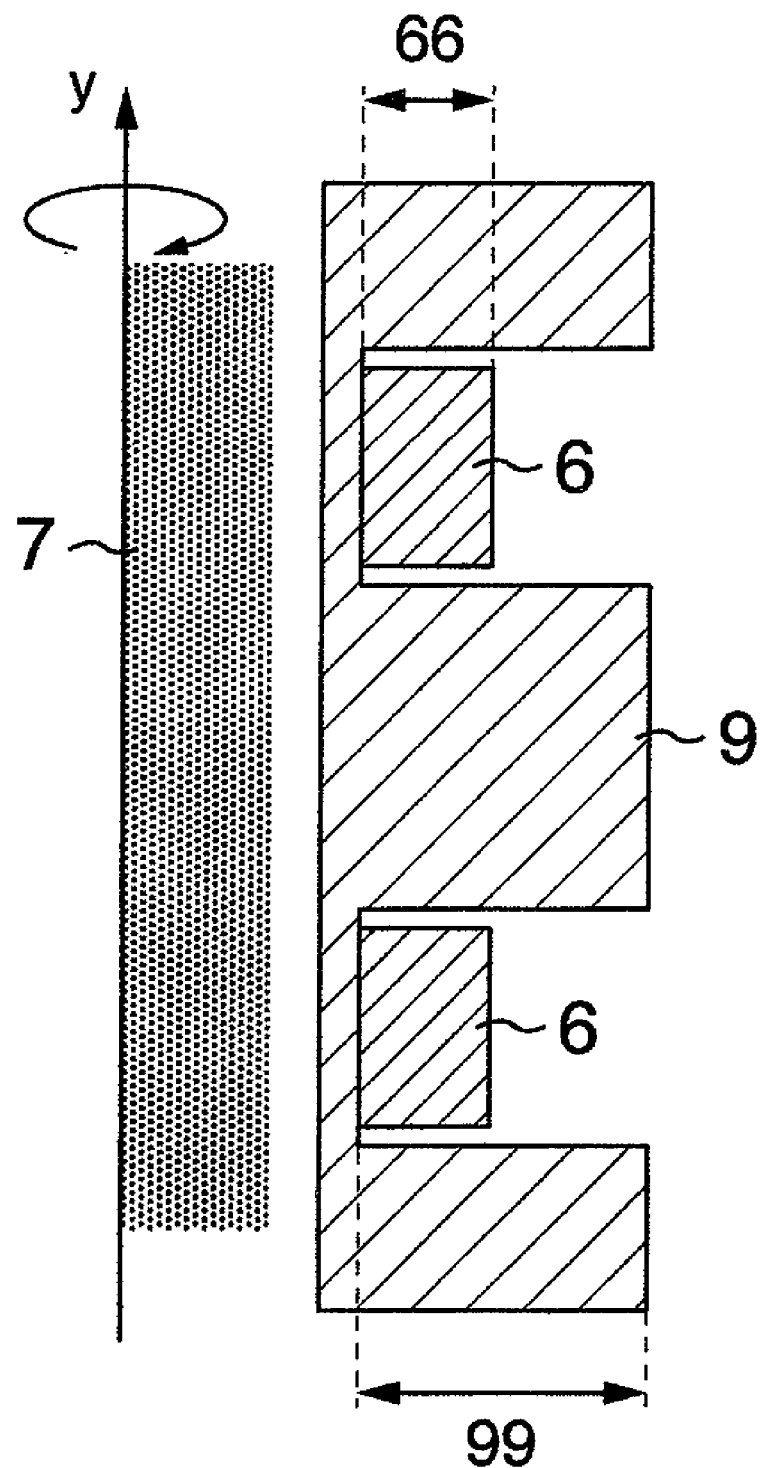
FIG. 7 is a cross sectional diagram of a coil according to an embodiment 2 of the present invention.

FIG. 7 shows a case where a grooved bobbin 9 that is formed with grooves for winding RF coils therearound is combined with RF coils 6 in a cylindrical shape. The product of the bulk susceptibility of the bobbin material and depth of the groove provided on the bobbin has only to be equal to the product of the bulk susceptibility of the RF coil 6 and thickness of the RF coil 6 with an error of several percent. Therefore, the groove depth 99 of the bobbin need not necessarily be the same as the thickness 66 of the RF coil as is shown in FIG. 7.

In the present embodiment, when adjusting the bulk susceptibility of the RF coil, preferably the coil is fabricated from material comprising a combination of substances having different magnetic susceptibility polarities, such as copper and constantan. In addition, the heterogeneity of the static magnetic field strength caused by an erroneous adjustment in the present embodiment can be corrected by providing the compensating substance 8 as shown in the embodiment 1.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An NMR probe equipped with an RF coil used for high frequency transmission, reception or transmission/reception during the measurement of an NMR signal, wherein:

a substance having a magnetic susceptibility of the same polarity as that of said RF coil is disposed between coil windings of said RF coil and outside the coil windings;

wherein said RF coil and said substance form a cylindrical configuration.

2. The NMR probe according to claim 1, comprising:

a bobbin for winding said RF coil therearound, wherein:

said substance having the magnetic susceptibility of the same polarity as that of said RF coil is disposed on a surface of said bobbin which is not contacted by said RF coil.

3. The NMR probe according to claim 1, wherein:
said substance having the magnetic susceptibility of the same polarity as that of said RF coil is fabricated from an insulant.
4. The NMR probe according to claim 2, wherein:
said substance having the magnetic susceptibility of the same polarity as that of said RF coil is fabricated from an insulant.
5. An NMR probe, comprising:
RF coils used for high frequency transmission, reception and transmission/reception during the measurement of an NMR signal; and
a bobbin around which said RF coils are wound, said bobbin having grooves for allowing said RF coils to be wound on the surface of said bobbin, wherein:
at least one of said bobbin and said RF coil winding is comprised of material whose bulk susceptibility is adjusted such that the difference of the product of the depth of the groove of said bobbin and the bulk susceptibility of said bobbin and the product of the winding thickness and bulk susceptibility of said RF coil winding is 5 percent or less.

* * * * *